(12) United States Patent
Tseng

(10) Patent No.: US 6,358,795 B1
(45) Date of Patent: Mar. 19, 2002

(54) METHOD OF MAKING STACKED CAPACITOR IN MEMORY DEVICE

(75) Inventor: Horng-Huei Tseng, Hsinchu (TW)

(73) Assignee: Vanguard International Semiconductor Corp., Hsinchu (TW)

(*) Notice: Subject to any disclaimer, the term of this patent is extended or adjusted under 35 U.S.C. 154(b) by 0 days.

(21) Appl. No.: 09/661,099

(22) Filed: Sep. 13, 2000

(51) Int. Cl.⁷ ............................................. H01L 21/242
(52) U.S. Cl. ....................................... 438/255; 438/253
(58) Field of Search ................................ 438/239, 396, 438/397, 398, 253–255

(56) References Cited

U.S. PATENT DOCUMENTS

| | | | |
|---|---|---|---|
| 5,849,619 A | * 12/1998 | Cho et al. | 438/254 |
| 5,998,259 A | * 12/1999 | Chuang | 438/253 |
| RE36,786 E | 7/2000 | Fazan et al. | |
| 6,150,207 A | * 11/2000 | Chung et al. | 438/239 |

* cited by examiner

Primary Examiner—David Nelms
Assistant Examiner—Dung A Le
(74) Attorney, Agent, or Firm—J. C. Patents

(57) ABSTRACT

The method of the invention contains providing a substrate, which has several conductive structures formed thereon. The conductive structure has a cap layer on top. A dielectric layer is formed over the substrate and the conductive structures. The dielectric layer is patterned to form an opening between the conductive structures to expose the substrate, the sidewalls of the conductive structures, and a portion of top surface of the conductive structures. A conductive plug fills the opening. A dielectric block formed on the conductive plug. A conductive spacer is formed on the sidewalls of the dielectric block, having electrical contact to the conductive plug. The dielectric block is removed to expose the conductive plug. A hemi-spherical grain (HSG) layer is formed on the topographic surface of the substrate. A dielectric spacer is formed on sidewall of the conductive spacer to cover a portion of the HSG layer. The dielectric spacer includes a material different to the dielectric layer in different etching ratio. An etching back process is performed to remove the HSG layer without being covered by the dielectric spacer. The dielectric spacer is removed. A second dielectric layer and a capacitor electrode layer are formed over the substrate.

18 Claims, 2 Drawing Sheets

US 6,358,795 B1

METHOD OF MAKING STACKED CAPACITOR IN MEMORY DEVICE

BACKGROUND OF THE INVENTION

1. Field of Invention

The present invention relates to semiconductor fabrication. More particularly, the present invention relates to a method of fabricating stacked capacitor in a memory device.

2. Description of Related Art

For a memory device such as dynamic random access memory (DRAM), generally, an array of capacitors on the substrate are storing the binary data by charging or discharging the capacitors. One capacitor acts one bit of memory for storing the binary data "0" or "1" corresponding to the status of capacitor being "charged" or "discharged", respectively. The action of read/write in the DRAM is done through a transfer field effect transistor (TFET), in which a source of the TFET is coupled to a bit line (BL), a drain is coupled to the capacitor and a gate is coupled to a word line (WL). The BL carries a voltage level to charge the capacitor through the TFET, where the TFET is selectively controlled by the WL to be activated or inactivated. Thus a writing action can be done. On the other hand, if one wants to read the binary data having been stored, the BL is switched to a comparator circuit, or a sense amplifier, to check the voltage status of the capacitor for the reading action. Therefore the charges stored in the capacitor is essential to a memory quality in the DRAM.

The charges stored in the capacitor depends on the capacitance of the capacitor. The capacitance is determined by the storing area of the storage electrode, the isolating reliability between an upper electrode and a lower electrode of the capacitor, and dielectric constant of dielectric, which has been chosen. To be able to store more data, the density of the capacitors used in the memory device tends to increase. This results in the storage charges would be decreased. If the storage charges can stay high, the affections of noise to the sense amplifier for reading can be effectively reduced and it is not necessary to refresh the voltage level of the capacitor, frequently.

While the integration is increasing, the size of memory cell in a DRAM is reduced, accordingly. As known by one skilled in the art, the reduced size of the capacitor gives a result of lower capacitance. If the capacitance is decreased, the soft error due to the a particles can happen with higher probability. Therefore, it is desired that a capacitor has a reduced size but can keep sufficient capacitance. In order to achieve this purpose, various capacitor structure designs have been proposed, such as a stacked capacitor. However, an efficient method to fabricate a desired capacitor structure is still under developing. A method to fabricate a stack capacitor has been disclosed in U.S. Pat. No. RE36786. However, the method is still not efficient to have the desired capacitance.

SUMMARY OF THE INVENTION

The invention provides a method for fabricating a capacitor in a memory device. The method includes providing a substrate, which has several conductive structures formed thereon. The conductive structure has a cap layer on top. A doped region is formed in the substrate between the conductive structures. A first dielectric layer is formed over the substrate and the conductive structures. The first dielectric layer is patterned to form an opening between the conductive structures, where the opening exposes the doped region of the substrate, the sidewalls of the conductive structures, and a portion of top surface of the conductive structures. A conductive plug fills the opening. A dielectric block formed on the conductive plug. A conductive spacer is formed on the sidewalls of the dielectric block. The conductive spacer has electrical contact to the conductive plug. The dielectric block is removed to further expose the conductive plug. A hemi-spherical grain (HSG) conductive layer is formed on the topographic surface of the substrate. A dielectric spacer is formed on sidewall of the conductive spacer to cover a portion of the HSG conductive layer. The dielectric spacer includes a material different to the first dielectric layer in significantly different etching ratio. An etching back process is performed to remove the HSG conductive layer without being covered by the dielectric spacer, so that the first dielectric layer and the conductive plug are exposed again. The dielectric spacer is removed using an etching process with an etching selectivity on the dielectric spacer. A second dielectric layer, serving as a capacitor dielectric, is formed over the substrate. A capacitor electrode layer is formed over the substrate.

In the foregoing, the conductive structure includes, for example, a gate electrode, a world line, or a conductive line. The first dielectric layer includes, for example, a two-layer structure with a lower dielectric layer surrounding the conductive structures, and an upper dielectric layer formed over the first dielectric layer and the conductive structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

In order to increase the capacitance of the capacitor in a limited space for the memory device, such as the DRAM device, the capacitor is necessary to be designed to have sufficient charge storage area. The capacitor structure also associates a fabrication process. FIGS. 1A–1E are cross-sectional view, schematically illustrating the process for fabricating a capacitor for a DRAM device, according to one preferred embodiment of this invention.

Figure 1A:
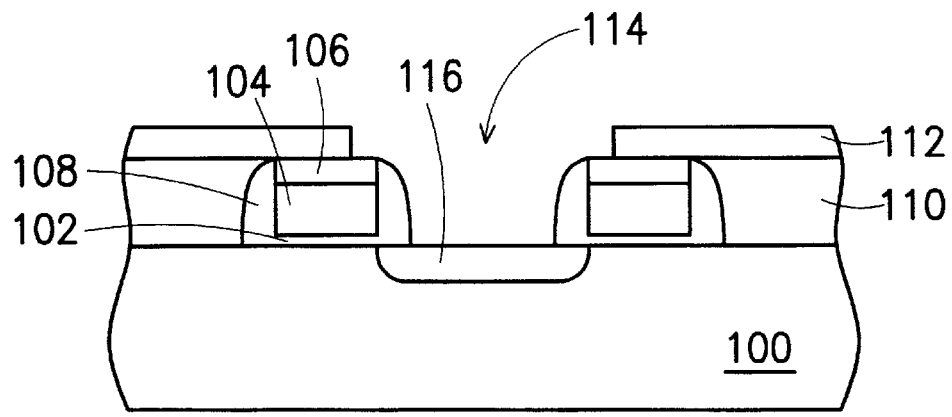
FIGS. 1A–1E are cross-sectional view, schematically illustrating the process for fabricating a capacitor for a DRAM device, according to one preferred embodiment of this invention.

In FIG. 1A, a substrate 100 is provided. Several conductive structures are formed on the substrate 100. The conductive structures includes, for example, gate electrodes and word lines connecting the gate electrodes, or conductive lines. Here, only the cross-sectional view crossing the gate electrode is shown. The gate electrode typically includes a gate oxide layer 102 on the substrate 100, a polysilicon gate layer 104 on the gate oxide layer 102, and a cap layer 106 on the polysilicon gate layer 104. Moreover, a spacer 108 is also formed on a sidewall of the gate electrode. A doped region 116 serving, for example, as a source/drain region is also formed in the substrate 100 between the gate electrodes.

Then, a dielectric layer is formed over the substrate 100 and also covers the gate electrodes. The dielectric layer can, for example, has a two-layer structure, including a lower dielectric layer 110 and an upper dielectric layer 112. The lower dielectric layer 110 surrounds the gate electrode, and the upper dielectric layer 112 is formed on the lower dielectric layer 110. The dielectric layer 110 include, for example, silicon oxide with a thickness of, for example, 3000–8000 angstroms. The dielectric layer 112 includes, for example, silicon nitride with a thickness of, for example, 500–2000 angstroms. The dielectric layers 110, 112 are patterned to form an opening 114, which exposes the doped region 116 in the substrate 100 between the gate electrodes. The side surface of the gate electrode and a portion of the cap layer 106 are also exposed by the opening 114, where the side surface is the outer surface of the spacer 108 in the example.

Figure 1B:
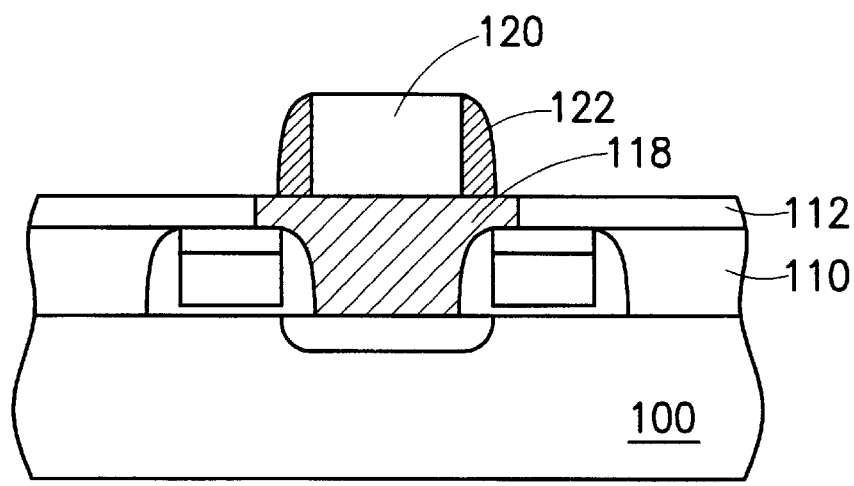

In FIG. 1B, a conductive plug 118 is formed to fill the opening 114. The conductive plug is formed, for example, by depositing a preliminary conductive layer, such as copper, tungsten, polysilicon, or aluminum, and performing a chemical mechanical polish (CMP) process to remove the top portion of the preliminary conductive layer, using the dielectric layer 112 as the polishing stop.

A dielectric block 120 is formed on the conductive plug 118. The dielectric block 120 can be formed by depositing a dielectric layer over the dielectric layer 112 and the conductive plug 118, and patterning the dielectric layer into the dielectric block. Here, the dielectric block includes a different material from the dielectric layer 112, so as to have a desired etching selectivity during patterning. A conductive spacer 122 is formed on a sidewall of the dielectric block 120. The conductive spacer can by formed by, for example, depositing a preliminary conductive layer over a topographic surface of the substrate 100, and performing an etching back process on the preliminary conductive layer. The remaining portion of the preliminary conductive layer after the etching back process is the conductive spacer 122 on the sidewall of the dielectric block 120. Since the height of the conductive spacer is related to the thickness of the dielectric block 120, so as to increase the charge storage area, the thickness of the dielectric block 120 has a thickness of, for example, 4000–10000 angstroms. The formation of the dielectric block 120 is essential to increase the capacitance. Since the dielectric block 120 can be easily formed with the desired dimension, this allows the conductive spacer 122 to be formed with better step coverage capability. In general, the dielectric block 122 is not limited to have only one block. It can have several narrow blocks, such as two. Here, the conductive spacer 122 has electric contact with the conductive plug 118.

Figure 1C:
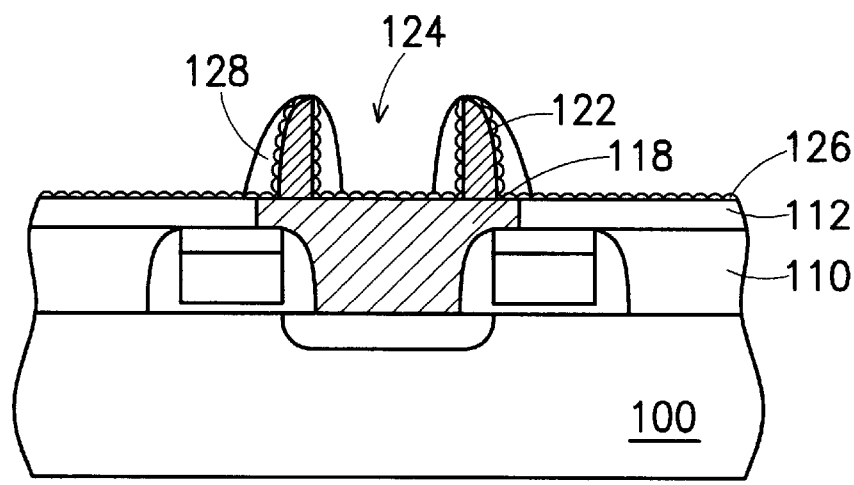

In FIG. 1C, the dielectric block 120 is removed by etching, such as the wet etching with, for example, HF acid solution, which has a sufficient etching selectivity on silicon oxide to silicon nitride of the dielectric layer 112. After the dielectric block 120 is removed, the conductive spacer 122 and the conductive plug 118 are further exposed. The conductive spacer 122 provide extra charge storage area. Moreover, the charge storage area can be further increased by forming a hem-spherical grain (HSG) structure. For example, a HSG conductive layer 126, such as a HSG silicon layer 126, is formed over the substrate 100. In this situation, the portion of the HSG silicon layer 126 on the dielectric layer 112 is necessary to be removed. This can be done by forming a dielectric spacer 128 on a sidewall of the conductive spacer 122, so as to cover a portion of the HSG silicon layer 128 on the sidewall of the conductive spacer 122. The other portion of the HSG silicon layer 126 not being covered by the dielectric spacer 128 is to be etched away later, using the dielectric spacer 128 as the mask. The dielectric spacer 128 is chosen to include a different material from the dielectric layer 112, such as silicon oxide. The dielectric spacer 128 can be formed by, for example, depositing a conformal dielectric layer over the substrate 100, and performing an etching back process on the dielectric layer. The remaining portion is the dielectric spacer 128.

Figure 1D:
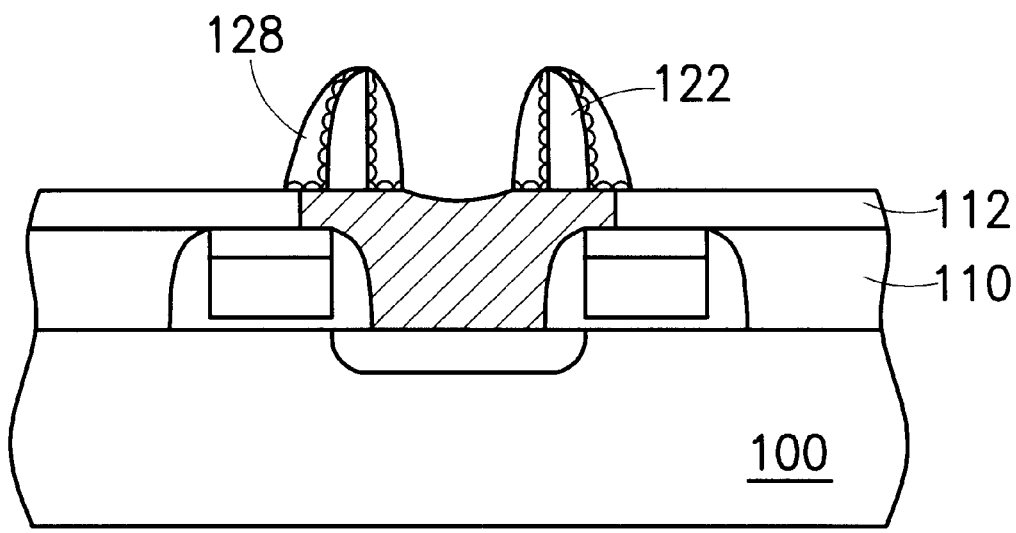

In FIG. 1D, the portion of the HSG silicon layer 126 is removed by etching, such as an anisotropic etching process using the dielectric spacer 128 as the etching mask. Since the thickness of the HSG silicon layer 126 is quite small, the over-etching applied on the HSG silicon layer 126 may also etch the conductive plug 118. There is no harm for this over etching. At the current stage, the dielectric layer 112 and the conductive plug are exposed again. Due to the dielectric spacer 128 and the dielectric layer 112 have different material, an etching selectivity can be achieved for removing the dielectric spacer 128. Due to the HSG structure, the remaining portion of the HSG silicon layer 126 on the conductive spacer 122 can further enhance the charge storage area.

Figure 1E:
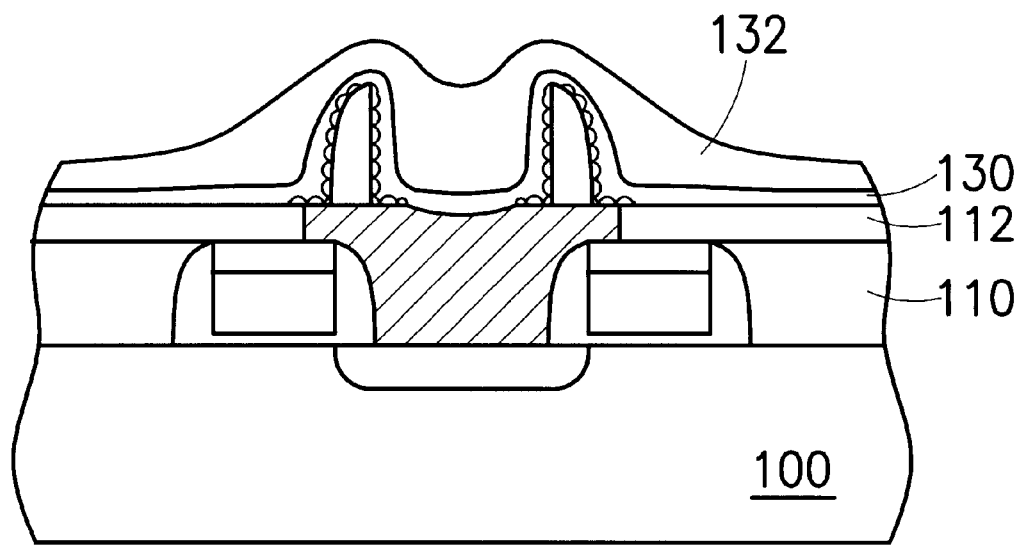

In FIG. 1E, a capacitor dielectric layer 130 and a conductive layer 132 are sequentially formed over the substrate 100. The capacitor dielectric layer 130 includes, for example, an oxide/nitride (ON) dielectric or an oxide/nitride/oxide (O/N/O) dielectric as well known by the skilled artisans. The conductive layer 132 serves as the capacitor electrode. The subsequent fabrication process to accomplish the formation of capacitor, such as pattering the capacitor dielectric layer 130 and the conductive layer 132 are also well known by the skilled artisans, no further descriptions are provided.

In the foregoing, the capacitor is formed on the doped region 116 of the gate electrode. However, the gate electrode can be a general conductive structure, such as a conductive line or word line in the memory device.

In summary, the present invention has several features. The dielectric block 120 is employed so as to have easy method to form the conductive spacer 122. The material choice for the dielectric spacer, the dielectric block 120, and the dielectric layer 112 are properly arranged, so as to achieve the necessary etching selectivity between them. This allows the etching processes can be easily performed. The HSG silicon layer 126 on the conductive spacer 122 can be properly etched by using the dielectric spacer 128. The two-layer dielectric layer can also be a single dielectric layer with proper material, so as to have desired etching selectivity. Most of the etching processes are performed under the self-aligned manner without extra photolithographic process. This also reduces the fabrication cost.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of fabricating a capacitor on a memory device, the method comprising:

provoding a substrate, wherein the substrate has conductive structures with a cap layer on top;

forming a dielectric layer over the substrate and the conductive structures;

patterning the dielectric layer to form an opening between the conductive structures, wherein the opening exposes a portion of the substrate between the conductive structures and a side surface of the conductive structures;

filling a conductive plug into the opening;

forming a dielectric block on the conductive plug;

forming a conductive spacer on a sidewall of dielectric block, wherein the conductive spacer has electric contact to the conductive plug;

removing the dielectric block;

forming a hemi-spherical grain (HSG) conductive layer over a topographic surface over the substrate;

forming a dielectric spacer on a sidewall of the conductive spacer to cover a portion of the HSG conductive layer, wherein the dielectric spacer includes a material to have different etching selectivity to the dielectric layer;

removing the HSG conductive layer using the dielectric spacer as an etching mask, wherein the dielectric layer and the conductive plug are exposed;

removing dielectric spacer with an etching ratio to the dielectric layer;

forming a capacitor dielectric layer over the substrate; and forming a conductive layer over the substrate.

2. The method of claim 1, wherein the step of forming the dielectric layer comprises forming a first dielectric layer surrounding the conductive structures and forming a second dielectric layer over the first dielectric layer and the cap layer of the conductive structure.

3. The method of claim 2, wherein the first dielectric layer comprises silicon oxide and the second dielectric layer comprises silicon nitride.

4. The method of claim 2, wherein the first dielectric layer has a thickness of about between 3000 and 8000 angstroms.

5. The method of claim 2, wherein the second dielectric layer has a thickness of about between 500 and 2000 angstroms.

6. The method of claim 1, wherein in the step of patterning the dielectric layer to form the opening, the opening also exposes a portion of a top surface of the conductive structures.

7. The method of claim 1, wherein the conductive structures comprises a polysilicon line.

8. The method of claim 1, wherein the conductive structures comprises a gate electrode.

9. The method of claim 1, wherein before the step of forming the dielectric layer, the method comprises forming a doped region in the substrate between the conductive structures.

10. The method of claim 1, wherein the dielectric spacer comprises silicon oxide while the dielectric layer includes silicon nitride on top.

11. The method of claim 1, wherein the step of forming the dielectric block comprises:

forming a preliminary dielectric layer over the substrate; and patterning the preliminary dielectric layer to form the dielectric block.

12. The method of claim 1, wherein in the step of forming the dielectric block, the dielectric block is formed to have a thickness of about 4000–10000 angstroms.

13. The method of claim 1, wherein the step of forming the dielectric spacer on the sidewall of the conductive spacer comprises:

forming a preliminary dielectric layer on the HSG conductive layer to at least cover over the sidewall of the conductive spacer; and performing an etching back process on the preliminary conductive layer to expose the HSG conductive layer, wherein a remaining portion of the preliminary dielectric form the dielectric spacer.

14. The method of claim 1, wherein the conductive spacer comprises polysilicon, which is optionally doped.

15. The method of claim 1, wherein the step of forming the conductive spacer comprises:

forming a conformal conductive layer over the substrate at least on the sidewall of the dielectric block; and performing an etching back process to remove a horizontal portion of the conformal conductive layer.

16. The method of claim 1, wherein the HSG conductive layer comprises silicon HSG.

17. The method of claim 1, wherein the capacitor dielectric layer comprises oxide/nitride/oxide dielectric.

18. The method of claim 1, wherein the conductive layer comprises polysilicon.

* * * * *